(12) United States Patent
Koh

(10) Patent No.: US 6,830,997 B2
(45) Date of Patent: Dec. 14, 2004

(54) SEMICONDUCTOR DEVICES AND METHODS FOR FORMING SEMICONDUCTOR DEVICES

(75) Inventor: Kwan Ju Koh, Bucheon-si (KR)

(73) Assignee: ANAM Semiconductor, Inc., Seoul (KR)

( * ) Notice: Subject to any disclaimer, the term of this patent is extended or adjusted under 35 U.S.C. 154(b) by 0 days.

(21) Appl. No.: 10/663,412

(22) Filed: Sep. 16, 2003

(65) Prior Publication Data

US 2004/0097048 A1 May 20, 2004

(30) Foreign Application Priority Data

Sep. 17, 2002 (KR) .................... 10-2002-0056423

(51) Int. Cl.⁷ ............... H01L 21/3205; H01L 21/4763; H01L 21/336
(52) U.S. Cl. ............ 438/585; 438/305; 438/592; 438/595
(58) Field of Search ............... 438/142, 161, 438/258, 305, 585, 592, 593, 595, 597, 622

(56) References Cited

U.S. PATENT DOCUMENTS

| | | | | |
|---|---|---|---|---|
| 6,017,809 A | * | 1/2000 | Inumiya et al. ............ | 438/585 |
| 6,380,009 B1 | * | 4/2002 | Battersby .................... | 438/161 |
| 6,531,749 B1 | * | 3/2003 | Matsuki et al. ............. | 257/388 |
| 6,555,450 B2 | * | 4/2003 | Park et al. .................. | 438/533 |
| 6,624,015 B2 | * | 9/2003 | Patelmo et al. ............. | 438/593 |
| 6,624,483 B2 | * | 9/2003 | Kurata ........................ | 257/387 |
| 6,673,712 B1 | * | 1/2004 | Yen ............................. | 438/633 |
| 6,746,900 B1 | * | 6/2004 | Liu et al. .................... | 438/142 |

* cited by examiner

Primary Examiner—John F. Niebling
Assistant Examiner—Walter L. Lindsay, Jr.
(74) Attorney, Agent, or Firm—Grossman & Flight, LLC

(57) ABSTRACT

Semiconductor devices and methods for forming semiconductor devices are disclosed. In a disclosed method, a gate of a semiconductor device is formed by separately forming a lower gate and an upper gate electrode on a semiconductor substrate. A lower gate polysilicon layer is first formed on the semiconductor substrate and selectively removed to form the lower gate electrode. LDD regions are formed on opposite sides of the lower gate electrode. A nitride film is formed and etched to form sidewalls of the lower gate electrode. Source and drain regions are formed by implanting impurity ions into the LDD regions on the opposite sides of the lower gate electrode. An upper gate polysilicon layer is formed. Then, the upper gate polysilicon layer is selectively removed to form an upper gate electrode. A silicide layer is then formed on the top and side surfaces of the upper gate electrode.

4 Claims, 3 Drawing Sheets

SEMICONDUCTOR DEVICES AND METHODS FOR FORMING SEMICONDUCTOR DEVICES

FIELD OF THE DISCLOSURE

This disclosure relates generally to semiconductor devices and, more particularly, to methods for forming semiconductor devices.

BACKGROUND

As semiconductor devices have become more highly integrated, the size of chips have decreased and the width of the polysilicon gates of the chips have become narrower.

A conventional method of forming a gate of a semiconductor device will now be described with reference to FIG. 1. A gate polysilicon layer is formed on a semiconductor substrate 11. Then, the gate polysilicon layer is selectively removed by an etching process using a photoresist pattern (not shown) to form a gate electrode 14.

A low concentration ion implantation process is performed to form LDD (lightly doped drain) regions 13. A nitride film is formed on top of the entire structure wherein the gate electrode 14 is formed. Then by etching the nitride film, the nitride film on side surfaces of the gate electrode 14 is left as sidewalls 15 of the gate electrode 14.

Impurity ions are implanted into the LDD regions 13 on both sides of the gate electrode 14 to form source/drain regions 12. A material for forming a silicide layer (e.g., metal) is deposited on a top surface of the entire structure and then an annealing process is performed to form a silicide layer 16 on the exposed surfaces.

In the conventional gate forming method as described above, as the size of the chip becomes smaller, the width of the polysilicon gate becomes narrower, and, as the polysilicon gate becomes narrower, the silicide resistance increases.

DETAILED DESCRIPTION

As an overview, a semiconductor device may be formed by performing a lower gate electrode forming process and other ion implantation process. (These processes may affect the characteristics of the device.) Then, an upper gate electrode is formed by depositing a gate polysilicon layer on top of the entire structure wherein the lower gate electrode is formed and then etching the gate polysilicon layer. A silicide layer is then formed on both top and side surfaces of the upper gate electrode to increase the surface area of the silicide layer.

A preferred method of forming a gate in a semiconductor device will now be described in greater detail with reference to FIGS. 2A to 2I.

Figure 2A:
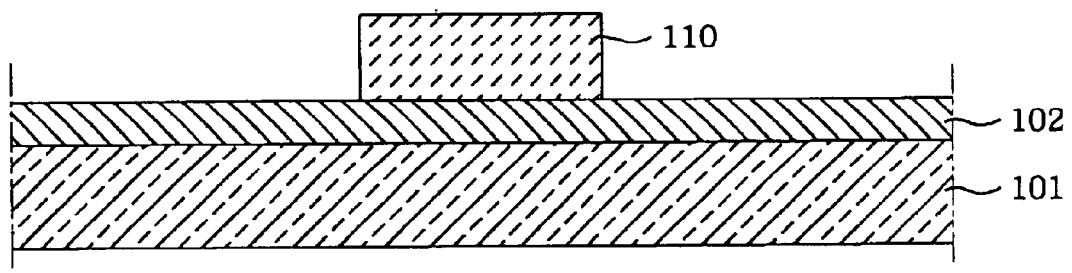
FIGS. 2A to 2I depict cross-sectional views of a semiconductor device being formed by the disclosed process.

Referring to FIG. 2A, a lower gate polysilicon layer 102 is formed on a semiconductor substrate 101 and a photoresist layer is coated thereon. At this time, the thickness of the lower gate polysilicon layer 102 is about 800~1000 angstrom.

Figure 2B:
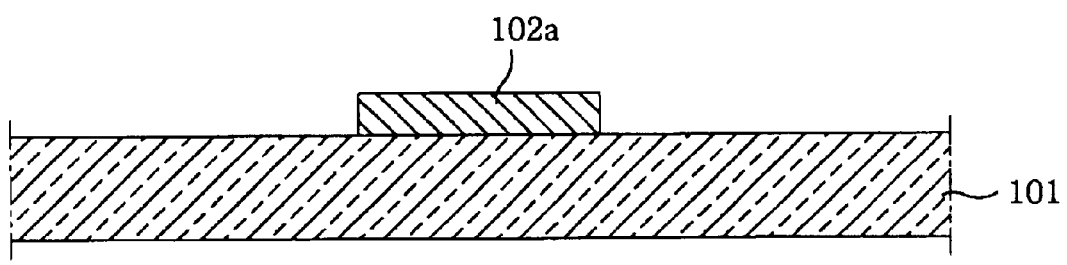

Referring to FIG. 2B, using a patterned photoresist layer 110, the lower gate polysilicon layer 102 is selectively removed by an etching process to form a lower gate electrode 102a.

Figure 2C:
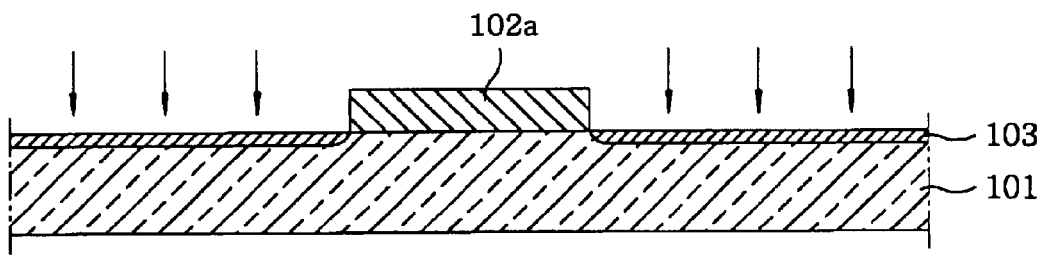

Referring to FIG. 2C, LDD regions 103 are formed on opposite sides of the lower gate electrode 102a through a conventional low concentration ion implantation process.

Figure 2D:
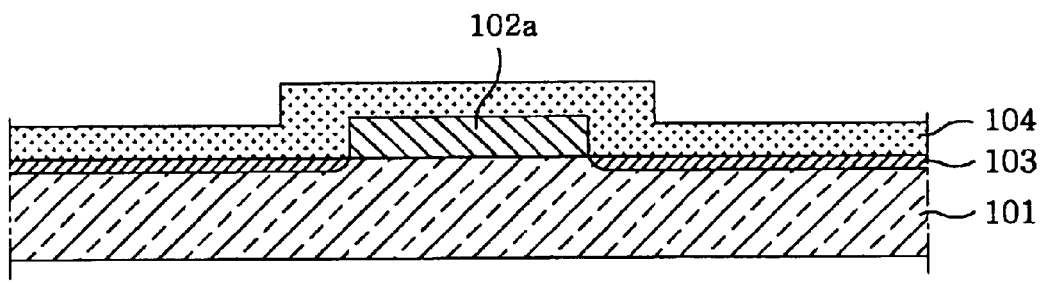

Referring to FIG. 2D, a nitride film 104 is formed on top of the entire structure of the semiconductor substrate wherein the lower gate electrode 102a is formed (i.e., on top of the entire structure shown in FIG. 2C).

Figure 2E:
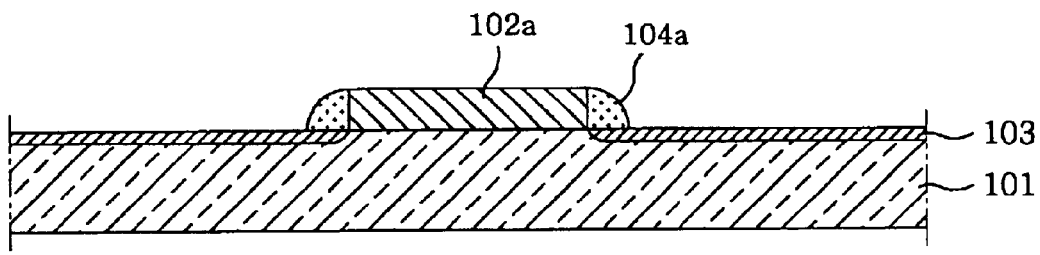

Referring to FIG. 2E, in an etching process of the nitride film 104, by over-etching, the nitride film 104 on the side surfaces of the lower gate electrode 102a are left as sidewalls 104a of the lower gate electrode 102a and the nitride film 104 on the top of the lower gate electrode 102a is totally removed.

Figure 2F:
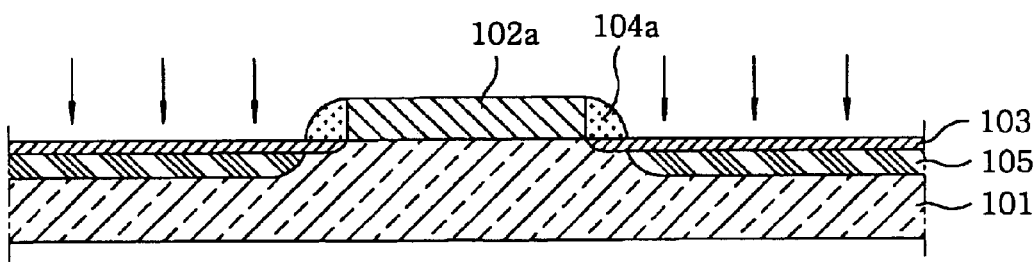

Referring to FIG. 2F, source and drain regions 105 are formed by implanting impurity ions into the LDD regions 103 on opposite sides of the lower gate electrode 102a.

Figure 2G:
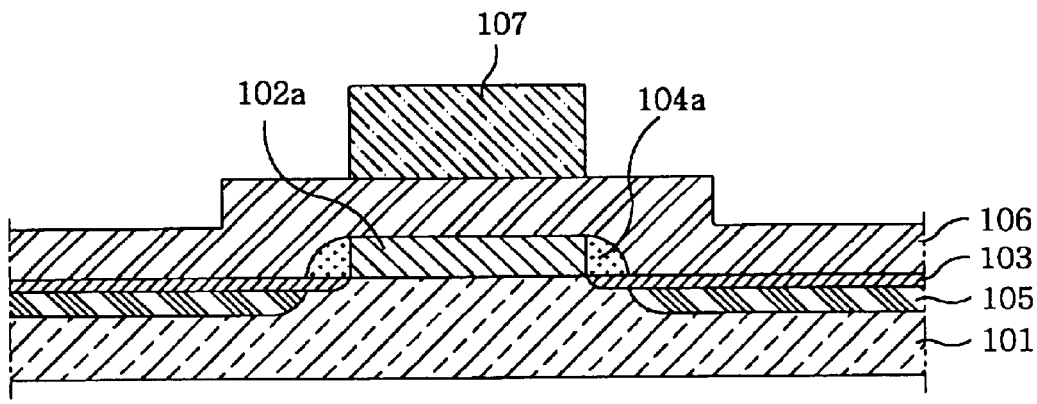

Referring to FIG. 2G, an upper gate polysilicon layer 106 is formed on top of the entire structure wherein the source and drain regions 105 are formed (i.e., on top of the entire structure shown in FIG. 2F). A photoresist layer 107 is then coated thereon.

Figure 2H:
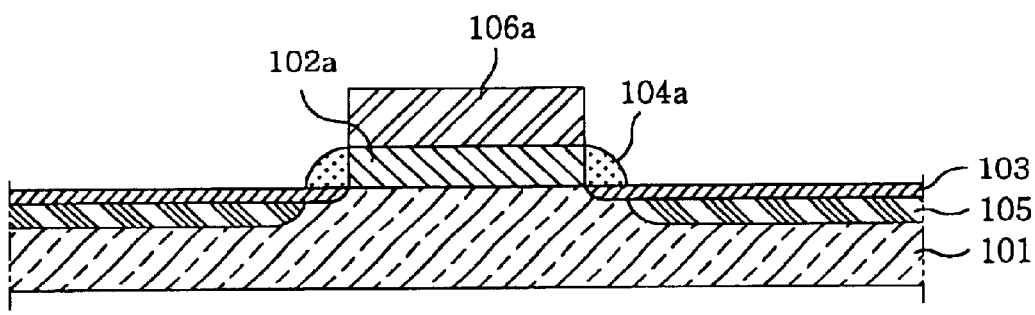

Referring to FIG. 2H, after patterning the photoresist layer 107, the upper gate polysilicon layer 106 is selectively removed through an etching process to form an upper gate electrode 106a. In this way, a gate electrode including the upper and the lower gate electrodes 102a, 106a is completed.

Figure 1:
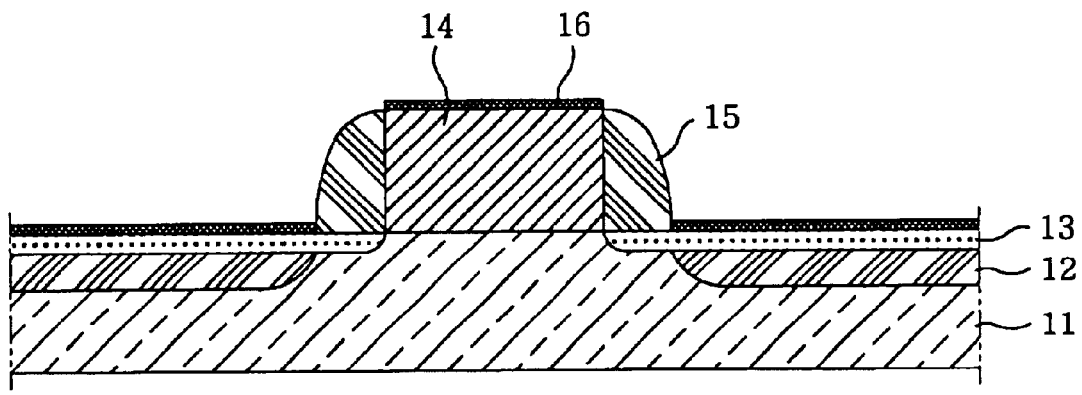
FIG. 1 is a cross-sectional view of a semiconductor device formed by a conventional process.
Figure 2I:
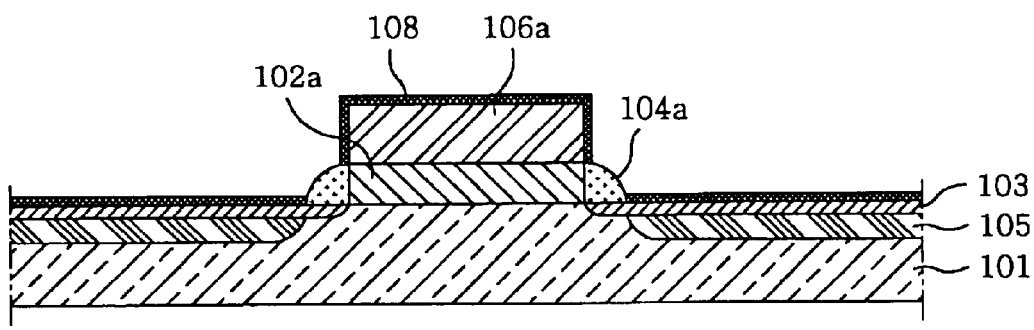

Referring to FIG. 2I, after a material for forming a silicide layer 108 (e.g., metal) is deposited on top of the entire structure wherein the upper gate electrode is formed, a silicide layer 108 is formed on the exposed surfaces by an annealing process. Specifically, the silicide layer 108 is formed on the top and side surfaces of the upper gate electrode 106a and the top surfaces of the source and drain regions 105. Since the silicide layer 108 is formed on the side surfaces of the upper gate electrode 106a as well as on the top surface thereof, the surface area of the silicide layer 108 is increased in comparison with the silicide layers of semiconductor devices formed by conventional processes wherein the silicide layer 16 is not formed on the side surfaces of the gate electrode 14 (see FIG. 1). Therefore, the resistance of the silicide layer 108 of the device of FIG. 2I is minimized.

From the foregoing, persons of ordinary skill in the art will appreciate that stable control of the semiconductor device can be obtained by increasing the surface area of the silicide layer 108 to minimize silicide resistance. Further, the thickness of the lower gate electrode 102 can be adjusted so that patterning of PR and BARC (bottom anti-reflection coating) of a small thickness is possible, thereby allowing the teachings of the present disclosure to be applied to fine patterning processes.

From the foregoing, persons of ordinary skill in the art will appreciate that semiconductor devices and methods for forming semiconductor devices have been disclosed wherein a gate electrode is formed with an upper and a lower gate electrode and a silicide layer is formed on both top and side surfaces of the upper gate electrode to increase the surface area of the silicide layer, thereby minimizing the silicide resistance.

In a disclosed method, a gate of a semiconductor device is formed by: forming a lower gate polysilicon layer on a semiconductor substrate; selectively removing the lower gate polysilicon layer to form a lower gate electrode; forming LDD regions on opposite sides of the lower gate electrode; forming sidewalls of the lower gate electrode;

forming source and drain regions on opposite sides of the lower gate electrode; forming an upper gate polysilicon layer on top of the entire structure; selectively removing the upper gate polysilicon layer to form an upper gate electrode; and forming a silicide layer on top and side surfaces of the upper gate electrode.

Preferably, the silicide layer is formed by depositing a material for forming the silicide layer on top of entire structure in which the upper gate electrode is formed and executing an annealing process to form the silicide layer on exposed surfaces of the entire structure.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for forming a gate of a semiconductor device comprising:

forming a lower gate polysilicon layer on a semiconductor substrate;

selectively removing a portion of the lower gate poly layer to form a lower gate electrode;

forming LDD regions on opposite sides of the lower gate electrode;

forming sidewalls of the lower gate electrode;

forming source and drain regions on the opposite sides of the lower gate electrode;

forming an upper gate polysilicon layer;

selectively removing portions of the upper gate polysilicon layer to form an upper gate electrode; and forming a silicide layer on top and side surfaces of the upper gate electrode.

2. A method as defined in claim 1, wherein forming the silicide layer comprises:

depositing a material on top of the upper gate electrode; and executing an annealing process to form the silicide layer.

3. A method as defined in claim 1, wherein forming sidewalls comprises:

forming a nitride film on top of the lower gate electrode and the LDD regions; and etching the nitride film to form the sidewalls of the lower gate electrode.

4. A method as defined in claim 1, wherein forming the source and drain regions comprises implanting impurity ions into the LDD regions on the opposite sides of the lower gate electrode.

* * * * *